United States Patent
Pei

(10) Patent No.: US 8,499,715 B2
(45) Date of Patent: Aug. 6, 2013

(54) COATING APPRATUS HAVING TWO COATING DEVICES FOR SUCCESSIVELY COATING SAME SURFACE OF SUBSTRATE

(75) Inventor: Shao-Kai Pei, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 201 days.

(21) Appl. No.: 13/076,428

(22) Filed: Mar. 31, 2011

(65) Prior Publication Data
US 2012/0097098 A1    Apr. 26, 2012

(30) Foreign Application Priority Data
Oct. 21, 2010  (TW) .............................. 99135877 A

(51) Int. Cl.
| B05B 7/06 | (2006.01) |
| B05C 13/02 | (2006.01) |
| C23C 16/00 | (2006.01) |
| C23C 14/00 | (2006.01) |

(52) U.S. Cl.
USPC ........... 118/316; 118/313; 118/730; 118/733; 118/500; 118/320; 156/345.55; 204/298.01; 204/298.15

(58) Field of Classification Search
USPC ................. 118/313–316, 500, 728–733, 304, 118/319, 320; 156/345.51–345.55; 204/298.01, 298.02, 298.15, 192.12
See application file for complete search history.

(56) References Cited

U.S. PATENT DOCUMENTS
4,745,088 A * 5/1988 Inoue et al. ..................... 117/98

* cited by examiner

*Primary Examiner* — Yewebdar Tadesse
(74) *Attorney, Agent, or Firm* — Altis Law Group, Inc.

(57) ABSTRACT

A coating apparatus includes a first coating device, a number of second coating devices and a number of substrate holders. Each of the substrate holders is rotatable relative to the first coating device and the second coating devices such that one of two opposite holding surfaces of the substrate holder alternately faces the first coating device and the second coating devices.

17 Claims, 8 Drawing Sheets

COATING APPRATUS HAVING TWO COATING DEVICES FOR SUCCESSIVELY COATING SAME SURFACE OF SUBSTRATE

BACKGROUND

1. Technical Field

The present disclosure relates to coating field, and particularly, to a coating apparatus including two coating devices for successively coating the same surface of a substrate.

2. Description of Related Art

For improving the surface properties of an electronic product, an upper film and a lower film are stacked on the surface of a preformed product. However, the two films are generally formed with different coating apparatuses located apart from each other. This requires transporting the preformed product between neighboring coating apparatuses. The preformed product can be contaminated very easily during the transportation process. That means the preformed product needs to be cleaned before forming the upper film thereon. Those factors are time consuming and decrease production efficiency. Therefore, it is desired to provide a coating apparatus to overcome at least this one shortcoming.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Figure 1:
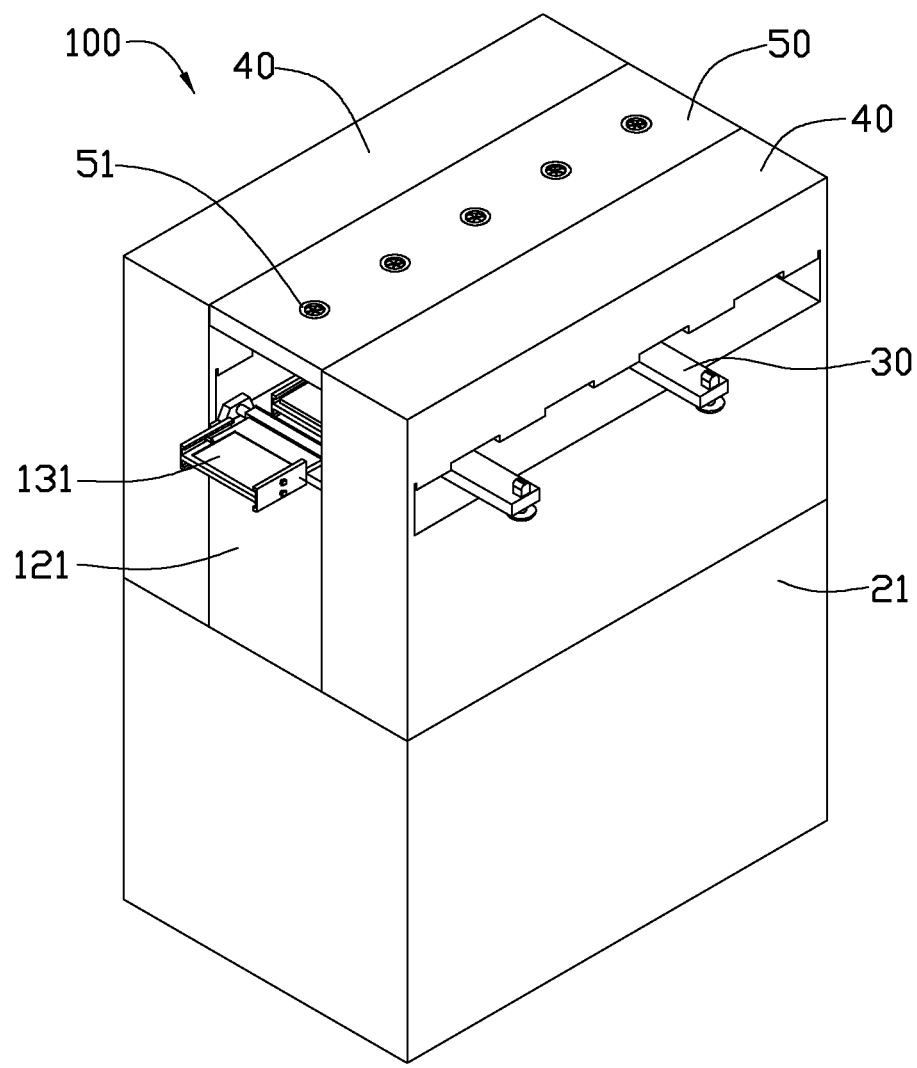
FIG. 1 is an isometric, perspective view of a coating apparatus in accordance with an exemplary embodiment of the present disclosure.
Figure 2:
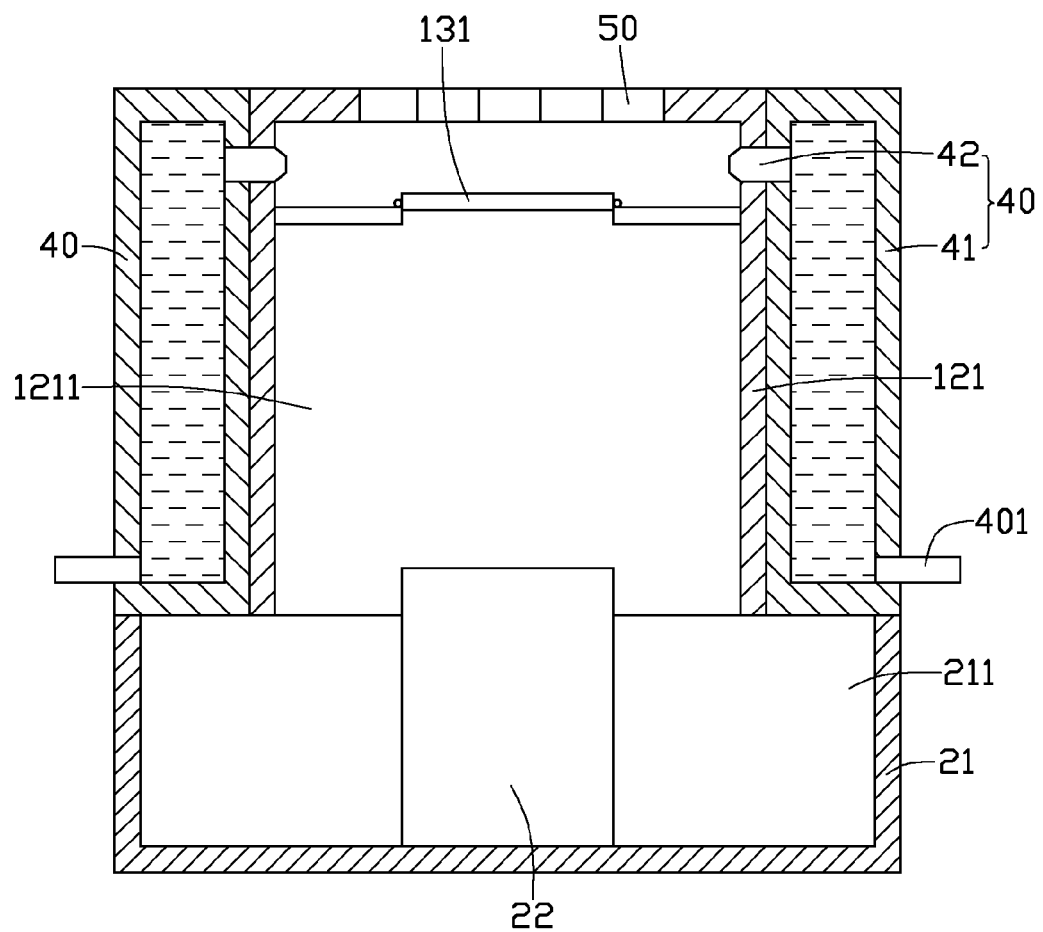
FIG. 2 is a cut-away view of the coating apparatus of FIG. 1.

Embodiments of the present disclosure will now be described in detail and with reference to the drawings.

Referring to FIGS. 1-4, a coating apparatus 100 provided in an exemplary embodiment of the present disclosure includes a coating chamber 21, a first coating device 22, a support housing 121, a plurality of rotatable substrate holders 131, a plurality of substrate transports 30, two second coating devices 40 and an exhaust 50.

The first coating device 22 is accommodated in the coating chamber 21. The coating device 22 can be a typical sputtering device, a typical chemical vapor deposition device or a typical ion vapor device.

The support housing 121 and the two second coating devices 40 are mounted on a top peripheral surface of the coating chamber 21, and the two second coating devices 40 are at two opposite sides of the support housing 121. In detail, referring to FIGS. 2 and 3, the support housing 121 includes a room 1211 communicating with the coating chamber 21, a support board 1212, a plurality of protrusions 1214 equidistantly extending from two peripheral sides of the support board 1212 and oriented along a longitudinal direction of the support board 1212, and a plurality of openings 1213 each passing through the support board 1212 and communicating with the coating chamber 21. Herein, every two protrusions 1214 aligned with each other and respectively formed on the two peripheral sides are defined as a couple. Each opening 1213 is defined between every neighboring couples. A rod 132 is extended through a corresponding substrate holder 131 and positioned at one end of the corresponding substrate holder 131. Two ends of each rod 132 are rotatably pivoted with a couple of corresponding protrusions 1214. In the present embodiment, the substrate holder 131 includes a first holding surface 1311 and a second holding surface 1312 opposite to the first holding surface 1311, using suction to hold the substrates to be coated on the first and second holding surfaces 1311, 1312. The rod 132 is rotatable around the central axis thereof. That is, the substrate holder 131 is rotatable around the central axis of the rod 132, and each opening 1213 can be fittingly and alternatively sealed with the first holding surface 1311 or the second holding surface 1312 of a corresponding substrate holder 131.

Figure 3:
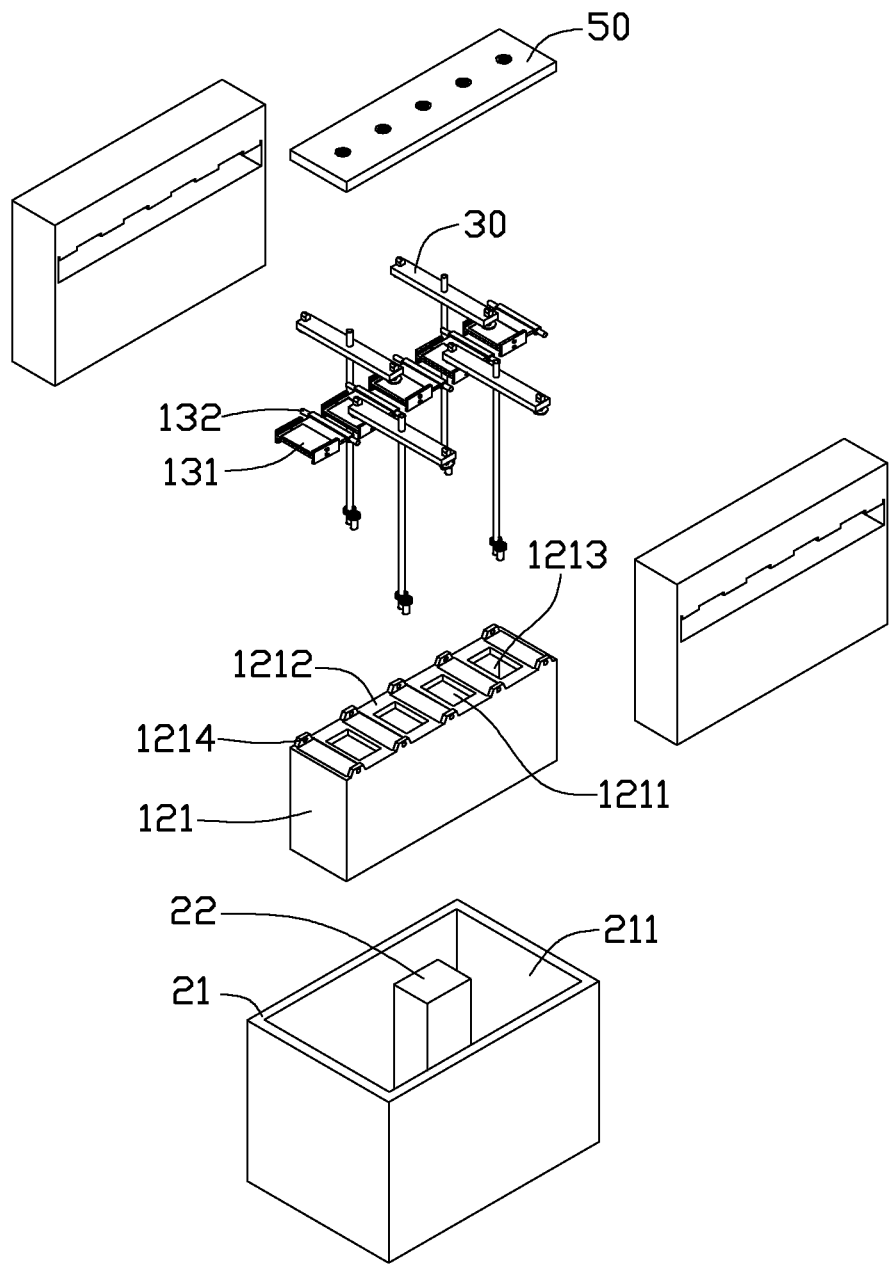
FIG. 3 is an exploded view of the coating apparatus of FIG. 1.
Figure 4:
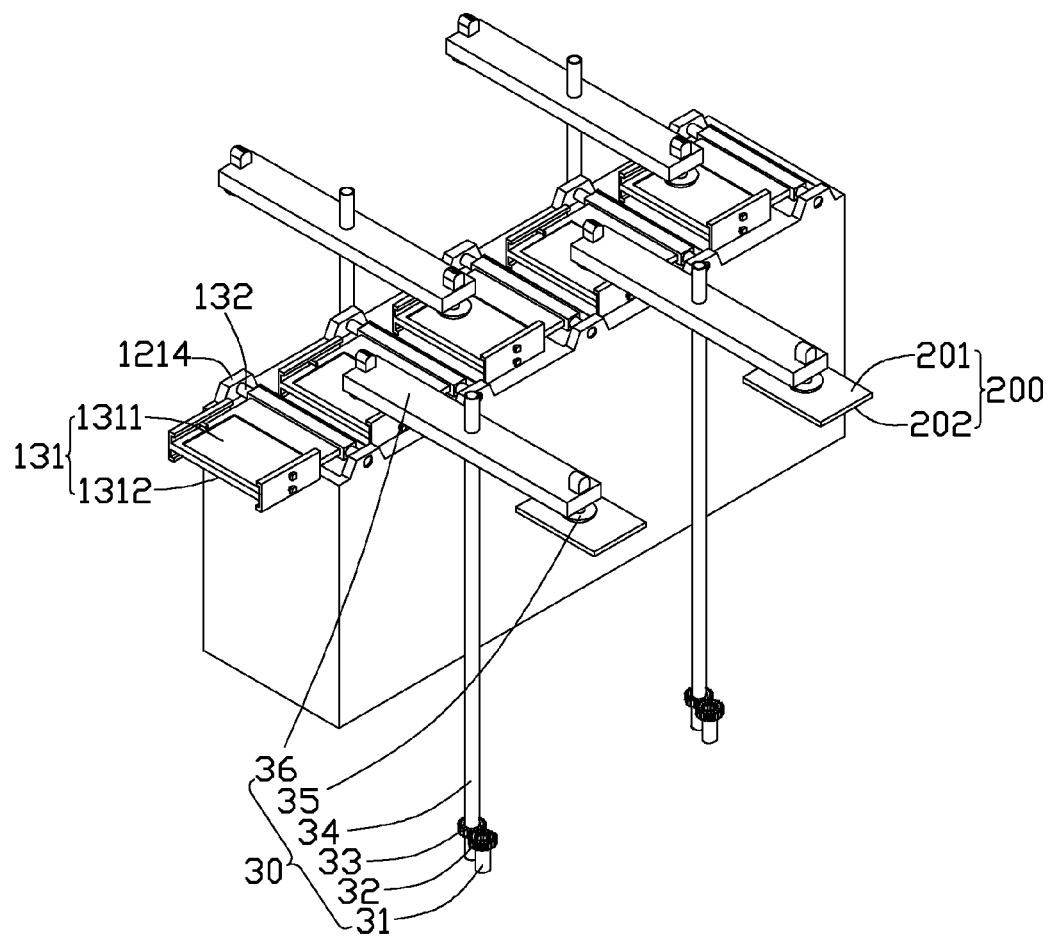
FIG. 4 through FIG. 8 are schematic views showing successive stages of the coating apparatus.

Referring to FIGS. 3 and 4, each substrate transport 30 includes a first rotatable pole 31, a first gear 32, a second gear 33, a second rotatable pole 34, two vacuum suction element 35 and a mounting pole 36. The first rotatable pole 31 extends through the first gear 32, and is rotatable around the central axis of itself. The second gear 33 is meshed with the first gear 32. The second rotatable pole 34 extends through the second gear 33. The first rotatable pole 31, the first gear 32, and the second gear 33 are accommodated in the coating chamber 21. The second rotatable poles 34 are equidistantly arranged beside the protrusions 1214. An end of the second rotatable pole 34 passes through the second gear 33 and is accommodated in the coating chamber 21, and another end of the second rotatable pole 34 perpendicularly extends through the center of the mounting pole 36. The two vacuum suction elements 35 are connected with two opposite ends of the mounting pole 36 and face the coating chamber 21. Each vacuum suction element 35 is movable relative to the mounting pole 36 along a direction parallel to the central axis of the second rotatable pole 34, and stops at a predetermined location. The vacuum suction elements 35 are configured for using suction to hold the substrates to be coated and transporting the substrates to the first holding surface 1311 or the second holding surface 1312 of the substrate holder 131. If the first rotatable pole 31 rotates around the central axis of itself, the first gear 32 will rotate around the first rotatable pole 31, the second gear 32, the second rotatable pole 34 and the mounting pole 36 will rotate around the central axis of the second rotatable pole 34. As such, the vacuum suction elements 35 can move relative to the substrate holders 131, and place a substrate to be coated onto a corresponding substrate holder 131.

Each second coating device 40 includes a tank 41 and a nozzle 42, and defines a liquid inlet 401 adjacent to the coating chamber 21. The nozzle 42 communicates with the tank 41 and is arranged over the substrate holders 131.

The exhaust 50 interconnects with the two second coating devices 40, and spaces from the support board 1212 of the support housing 121. The exhaust 50 includes a plurality of fans.

In the present embodiment, the first coating device 22 and the second coating devices 40 are integrated in the same apparatus, and each substrate holder 131 is rotatable relative to the first coating device 22 and the second coating devices 40. That means, two substrates respectively hold on the first holding surface 1311 and the second holding surface 1312 of the substrate holder 131 can be respectively coated by the first coating device 22 and the second coating devices 40 without long-distance transportation. Therefore, the substrates avoid contamination and time is saved.

Figure 5:
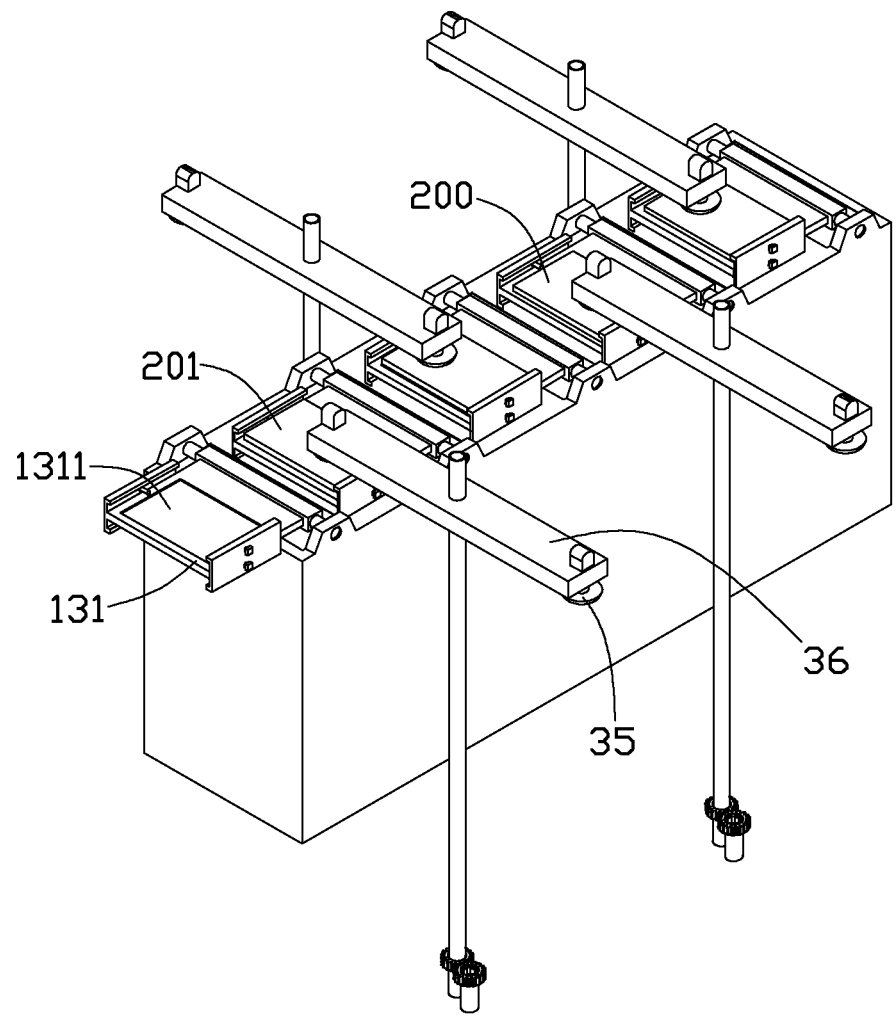
Figure 6:
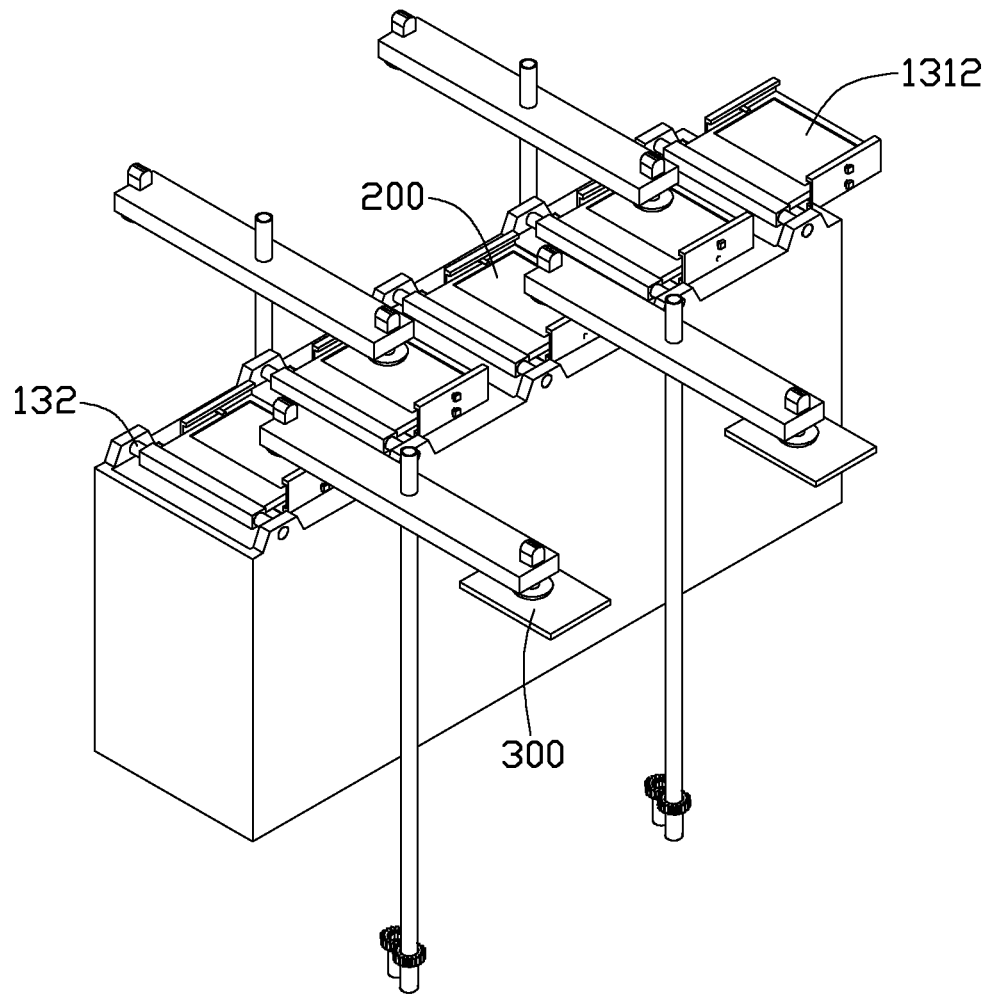
Figure 7:
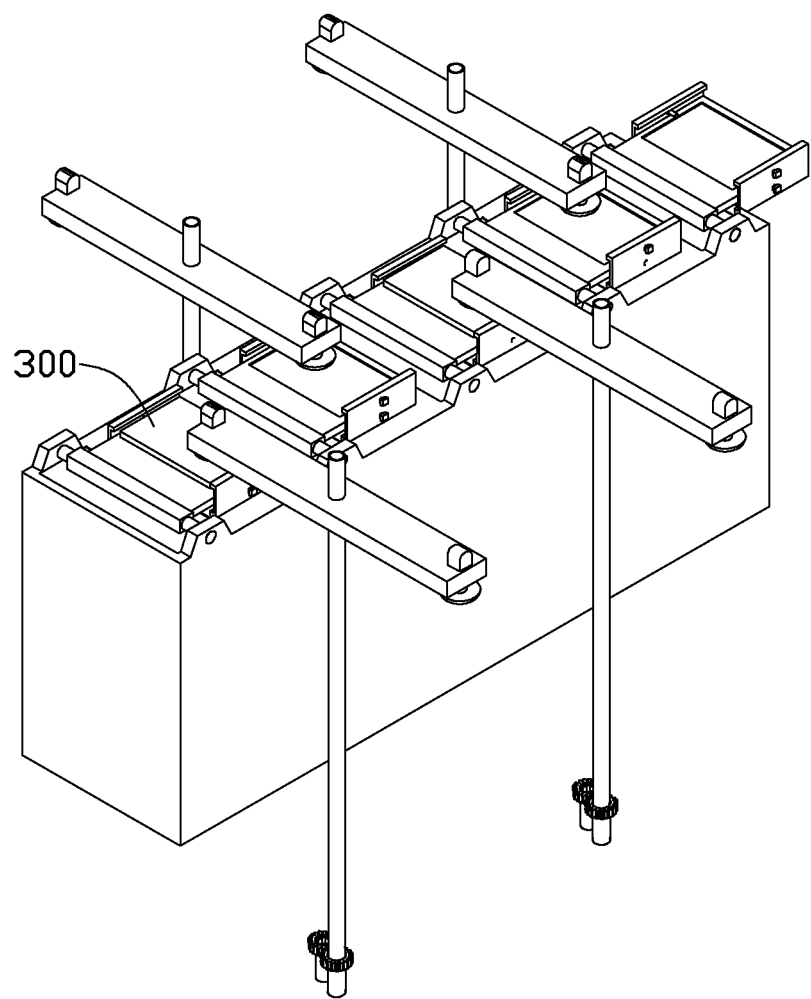
Figure 8:
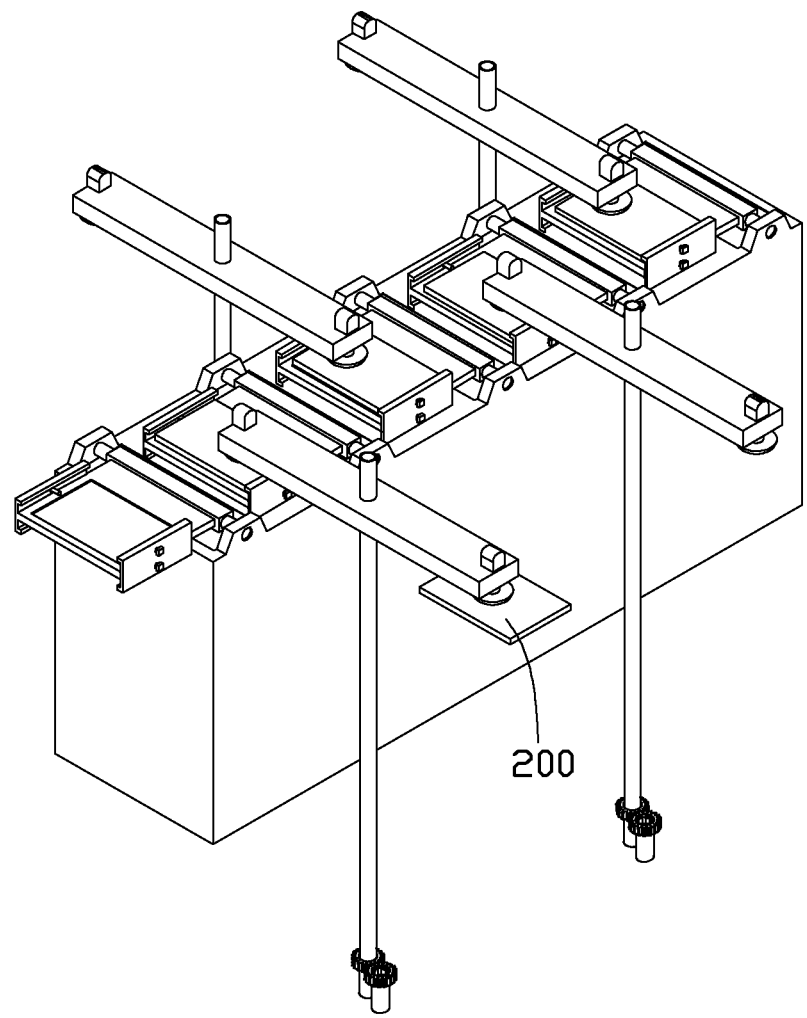

In actual use, forming a lower layer film and an upper layer film on a substrate 200 including a first coat surface 201 and a second coat surface 202 opposite to the first coat surface 201 for instance. The mounting pole 36 is first rotated until the vacuum suction elements 35 each use suction to hold a corresponding substrate 200. Next, referring to FIG. 5, the mounting pole 36 is rotated until the vacuum suction elements 35 each align with a corresponding substrate holder 131. Then are moved relative to the substrate holder 131 until the substrate 200 is placed on the first holding surface 1311 of the substrate holder 131 with the first coating surface 201 exposed to the outside. The substrate 200 is positioned on the substrate holder 131 with vacuum suction force. Subsequently, referring to FIGS. 5-7, the mounting pole 36 is rotated until the vacuum suction element 35 returns to its original position, using suction holds another substrate 300. Simultaneously, the substrate holder 131 is turned over around the rod 132 until the second holding surface 1312 is exposed to the outside. Another substrate 200 is transported to and is fixed on the second holding surface 1312 with the vacuum suction element 35. Referring to FIGS. 2, 3, 6 and 8, it is understood that, each substrate 200 on the first holding surface 1311 fittingly seals a corresponding opening 1213 and the first coating surface 201 faces the first coating device 22. A lower layer film is formed on the first coating surface 201 using the first coating device 22. Then, the substrate holder 131 is turned over around the rod 132 till each substrate 200 on the first holding surface 1311 faces the exhaust 50 and each substrate 200 on the second holding surface 1312 seals a corresponding opening 1213. An upper layer film is formed on the lower film using the second coating devices 42. Finally, the substrate 200 is removed from the substrate holder 131 using the vacuum suction element 35.

The described embodiments are intended to illustrate rather than limit the disclosure. Variations may be made to the embodiments without departing from the spirit of the disclosure. Accordingly, it is appropriate that the appended claims be construed broadly and in a manner consistent with the scope of the disclosure.

What is claimed is:

1. A coating apparatus, comprising:
   a first coating device;
   a plurality of second coating devices;
   a plurality of substrate holders, each substrate holder comprising two opposite holding surfaces and capable of being rotated relative to the first coating device and the second coating devices such that one of the two opposite holding surfaces alternately faces the first coating device and the second coating devices;
   a coating chamber accommodating the first coating device; and
   a support housing arranged on the coating chamber, the support housing comprising a support board, the support housing defining a plurality of openings in the support board and a room communicating with the coating chamber and the openings, each of the substrate holders rotatably positioned on the support board and capable of being rotated such that the two opposite holding surfaces successively seal two corresponding neighboring openings.

2. The coating apparatus of claim 1, wherein the substrate holders are arranged between the first coating device and the second coating devices.

3. The coating apparatus of claim 1, wherein the support housing further comprises a plurality of pairs of protrusions and a plurality of rods, the protrusions equidistantly extend from two opposite sides of the support board, two protrusions in each pair are aligned with each other, each of the rods extends through a corresponding substrate holder, and two ends of each rod are pivoted with a corresponding pair of protrusions.

4. The coating apparatus of claim 3, wherein the openings and the rods are alternately arranged.

5. The coating apparatus of claim 1, further comprising an exhaust, the plurality of second coating devices comprising two second coating devices arranged at opposite sides of the support chamber and on the coating chamber, the exhaust interconnecting with the two second coating devices.

6. The coating apparatus of claim 5, further comprising a plurality of substrate transports, each of the substrate transports capable of being rotated to transport a substrate to a corresponding substrate holder to be coated and remove the coated substrate from the corresponding substrate holder.

7. The coating apparatus of claim 6, wherein each of the substrate transports comprises a vacuum suction element, and the vacuum suction element is capable of moving relative to a corresponding substrate holder.

8. The coating apparatus of claim 1, wherein the second coating devices comprise two second coating devices arranged at opposite sides of the support chamber, each second coating device comprises a tank and a nozzle, and defines a liquid inlet adjacent to the coating chamber, and the nozzle communicates with the tank and is arranged over the substrate holders.

9. The coating apparatus of claim 1, wherein the first coating device is selected from the group consisting of a sputtering device, a chemical vapor deposition device and an ion vapor device.

10. A coating apparatus, comprising:
    a first coating device;
    a second coating device comprising a nozzle;
    a coating chamber receiving the first coating device;
    a support housing arranged on the coating chamber, the support housing comprising a support board, the support housing defining a plurality of openings in the support board and a room communicated with the openings and the coating chamber; and
    a plurality of substrate holders, one end of each substrate holder being rotatably connected to the support board, the nozzle being positioned over the substrate holders, each substrate holder comprising two opposite holding surfaces and capable of being rotated such that the two opposite holding surfaces successively seal two corresponding neighboring openings.

11. The coating apparatus of claim 10, wherein the support housing further comprises a plurality of pairs of protrusions and a plurality of rods, the protrusions equidistantly extend from two opposite sides of the support board, two protrusions in each pair are aligned with each other, each of the rods extends through a corresponding substrate holder, and two ends of each rod are pivoted with a corresponding pair of protrusions.

12. The coating apparatus of claim 11, wherein the openings and the rods are alternately arranged.

13. The coating apparatus of claim 10, further comprising an exhaust, the plurality of second coating devices comprising two second coating devices arranged at opposite sides of the support chamber and on the coating chamber, the exhaust interconnecting with the two second coating devices.

14. The coating apparatus of claim 13, further comprising a plurality of substrate transports, each of the substrate transports capable of being rotated to transport a substrate to a corresponding substrate holder to be coated and remove the coated substrate from the corresponding substrate holder.

15. The coating apparatus of claim 14, wherein each of the substrate transports comprises a vacuum suction element, and the vacuum suction element is capable of moving relative to a corresponding substrate holder.

16. The coating apparatus of claim 10, wherein the second coating devices comprise two second coating devices arranged at opposite sides of the support chamber, each second coating device comprises a tank and a nozzle, and defines a liquid inlet adjacent to the coating chamber, and the nozzle communicates with the tank and is arranged over the substrate holders.

17. The coating apparatus of claim 10, wherein the first coating device is selected from the group consisting of a sputtering device, a chemical vapor deposition device and an ion vapor device.

* * * * *